United States Patent
Artmann et al.

(10) Patent No.: US 6,555,443 B1
(45) Date of Patent: Apr. 29, 2003

(54) METHOD FOR PRODUCTION OF A THIN FILM AND A THIN-FILM SOLAR CELL, IN PARTICULAR, ON A CARRIER SUBSTRATE

(75) Inventors: Hans Artmann, Magstadt (DE); Wilhelm Frey, Palo Alto, CA (US); Manfred Moellendorf, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/438,072

(22) Filed: Nov. 10, 1999

(30) Foreign Application Priority Data

Nov. 11, 1998 (DE) .......................... 198 51 968
Aug. 5, 1999 (DE) .......................... 199 36 941

(51) Int. Cl.[7] .......................... H01L 21/30; H01L 21/46; H01L 21/302
(52) U.S. Cl. .......................... 438/458; 438/739; 156/344
(58) Field of Search .......................... 438/107, 108, 438/109, 421, 455–459, 619, 739, 960; 156/344, 584

(56) References Cited

U.S. PATENT DOCUMENTS

| 6,020,252 | A | * | 2/2000 | Aspar et al. | 438/458 |
| 6,107,213 | A | * | 8/2000 | Tayanaka | 438/762 |
| 6,120,597 | A | * | 9/2000 | Levy et al. | 117/3 |
| 6,150,239 | A | * | 11/2000 | Goesele et al. | 438/458 |
| 6,225,192 | B1 | * | 5/2001 | Aspar et al. | 438/460 |
| 6,280,643 | B1 | * | 8/2001 | Silverbrook | 216/27 |

OTHER PUBLICATIONS

Gösele et al., "Layer Splitting Process in Hidrogen–Implanted Si, Ge, SiC, and Diamond Substrates", Applied Physics Letters, 70, vol. 11, 1997, pp. 1390–1392.

Ohmura et al., "Shallow Donor Formation in Si Produced by Proton Bombardment", Phyica Status Solidi, 15, Jan. 16, 1973, pp. 93–98.

* cited by examiner

Primary Examiner—John F. Niebling
Assistant Examiner—Viktor Simkovic
(74) Attorney, Agent, or Firm—Kenyon & Kenyon

(57) ABSTRACT

A method for producing a thin film on a carrier substrate. For this purpose, a buried sacrificial layer is initially produced in the interior of a parent body, the buried sacrificial layer separating a layer from a residual body remaining from the parent body. After that, the carrier substrate is attached to the layer and the sacrificial layer is then removed. As a result, the thin film to be produced comes into being on the carrier substrate. The method is suitable for the production of electronic components or thin-film solar cells, the parent body being made up, for example, of monocrystalline silicon in which a sacrificial layer of porous silicon is produced.

26 Claims, 2 Drawing Sheets

METHOD FOR PRODUCTION OF A THIN FILM AND A THIN-FILM SOLAR CELL, IN PARTICULAR, ON A CARRIER SUBSTRATE

BACKGROUND INFORMATION

From a production of thin monocrystalline silicon layers on a carrier substrate, it is known to first join a silicon wafer to a carrier substrate and to subsequently produce a thin film of typically 5 µm to 50 µm by regrinding and polishing the wafer. These films are, for example, used as solar cells or for the production of electronic circuits on glass, polymers or ceramics.

Alternatively, it is known to allow a single-crystal silicon film having a thickness of 2 to 20 µm to grow epitaxially on a thin film of porous silicon and thereafter to join this grown silicon film to a carrier substrate. Thereupon, the porous silicon film is destroyed or it is detached from the epitaxially grown silicon film resulting in a thin single-crystal silicon film on a carrier substrate. This method is designated the ψ process.

In addition, the publication by Gösele et al., *Appl. Phys. Lett.*, 70, (11), 1997, 1340 ff. describes how to implant large quantities of hydrogen in a buried layer in a wafer in a silicon wafer so that $H_2$ bubbles are produced by conglomeration of the hydrogen, the $H_2$ bubbles splitting off an overlying thin layer of silicon.

Moreover, conventional thin-film solar cells are based either on the deposition of a photovoltaic, amorphous or polycrystalline layer system on non-adapted carrier substrates such as glass or ceramic. Known techniques for this purpose use, for example, CuInSe, CaTe, a-silicon or poly-silicon as the active layer. On the other hand, thin-film solar cells may also be based on deposition of an electronic or photovoltaic system on a lattice-adapted carrier substrate. Known methods for this purpose use, for example, as described above, the silicon epitaxy on silicon or the silicon epitaxy on porous silicon.

Such monocrystalline thin-film solar cells can achieve efficiencies of up to 20%; however, their manufacturing costs are relatively high due to the necessary epitaxial deposition.

One of the objects of the present invention is to provide a method to produce thin, particularly monocrystalline films with a thickness of typically 100 nm to 10 µm in a cost-effective manner on almost any carrier substrates, particularly however, those having high temperature stability. Moreover, these layers should be usable for thin-film solar cells, for example.

SUMMARY OF THE INVENTION

The method according to the present invention has the advantage that thin films can be produced on any carrier substrates in a cost-effective manner. In particular, the method according to the present invention is suitable for producing monocrystalline silicon films from conventional wafer material or highly thermostable substrates. Moreover, a plurality of thin films can be produced from one wafer in succession, only a thin sacrificial layer being consumed within the wafer material or the parent body each time so that the presented production method is particularly very cost-effective. In addition, large-area films can be produced with it if necessary.

It is also advantageous that pretextured wafers such as those used, for example, in the production of solar cells can also be used for the method according to the invention.

In addition to the production of thin silicon films, the method according to the invention is also suitable for the production of thin films from a large number of materials that can be made porous in particular, such as germanium or silicon carbide.

In contrast to the ψ process, with the use of a silicon wafer, for example, as a starting material for the production of a thin film on a carrier substrate, the film is composed of the original wafer material when the method according to the invention is applied and this possesses a maximum electrical quality. As a result, the method according to the invention is also suitable for the production of very high-quality electronic systems from cost-effective thin film silicon on any, i.e., even flexible carrier substrates, and for the production of high-quality monocrystalline c-silicon thin films on glass such as are required, for example, for thin-film solar cells.

Thus, the thickness of the thin film to be produced on the carrier substrate can be easily adjusted via the depth of the buried sacrificial layer or its distance from the surface of the parent body. The depth at which the sacrificial layer is produced can in turn be adjusted, for example, via the kinetic energy of hydrogen implanted in the parent body, the implanted hydrogen having a sharp stop profile as a function of the energy distribution of the hydrogen in a parent body such as silicon with the ultimate result that the energy and the energy distribution of the hydrogen determines the layer thickness of the thin film to be produced and the thickness of the buried sacrificial layer.

The sacrificial layer can be subsequently detached from the thin film to be produced advantageously by making the sacrificial layer porous by etching or anodization over the entire surface area followed by mechanical or chemical removal of the porous sacrificial layer. If silicon is used as the starting material, the porosity is brought about advantageously by converting the buried sacrificial layer into porous silicon, the structure of which is mechanically unstable and which can be removed easily chemically.

If necessary, this procedure may be followed by a thermal annealing step which improves the quality of the thin film produced by removing radiation damage resulting from the hydrogen implantation.

After the sacrificial layer is removed, the residual body remaining from the parent body can be reutilized to produce additional thin films.

With the aid of the porous silicon technique, the method according to the invention also makes it possible to implement solar cells without cost-intensive epitaxial steps.

Furthermore, a pn junction can be produced advantageously within the thin film to be produced by suitable doping via various methods.

The efficiency of a thin-film solar cell produced with the method according to the invention can be further increased by providing additional layers of defined, but varying porosity and thus varying refractive indices which form a broadband reflection filter on the side of the solar cell facing away from the incidence of light in order, as a result, to reflect the light transmitted through the stack of layers into the active area of the solar cell, i.e., the produced thin film with a pn junction.

It is also possible to increase the efficiency of the produced solar cell by adjusting the porosity of the thin film produced on the carrier substrate to a defined low level. This results in increased light scattering within the produced thin film which, for example, reduces transmission of radiation through the solar cell and consequently results in improved collection of light and a higher production of charge carriers.

Additional advantageous improvements of the efficiency of the solar cell may be obtained by multiple reflections within the solar cell which result from additional surface texturing of individual layers of the solar cell.

DETAILED DESCRIPTION

Figure 1:
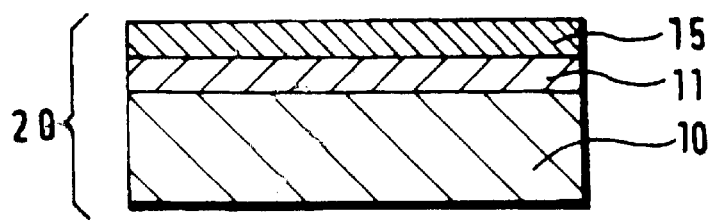
FIG. 1 shows a first step of a first embodiment of a method according to the present invention for producing a thin film from a parent body, with a layer structure being illustrated in section.

FIG. 1 shows a parent body 20 with a layer 15, a buried sacrificial layer 11 and a residual body 10. Thin film 15' to be produced will come into being at a later stage from layer 15. Parent body 20 is made up, for example, of silicon and is available, in particular, as a commercial or pretextured wafer. However, the method according to the present invention can also be implemented with numerous other materials such as, for example, silicon carbide or germanium. Parent body 20 is preferably monocrystalline so that thin film 15' to be produced can be used for high-performance electronic applications and solar cells.

In order to produce sacrificial layer 11 in parent body 20, the latter is first bombarded with, for example, hydrogen over its entire surface. Since hydrogen has a very marked stop profile in silicon, for example, the depth of penetration of the hydrogen in parent body 20 can be determined very precisely via the kinetic energy of the hydrogen or via the acceleration energy so that the hydrogen is implanted in parent body 20 at a defined depth which can be determined via the kinetic energy. The energy distribution of the hydrogen during the bombardment further influences the depth of sacrificial layer 11 so that the bombardment preferably takes place with nearly monoenergetic hydrogen in order to form buried sacrificial layer 11 to be as thin as possible. Typical thicknesses of the sacrificial layer are approximately 0.5 $\mu$m to 2.5 $\mu$m. The layer in parent body 20 which is implanted with hydrogen thus defines buried sacrificial layer 11. The production of a buried sacrificial layer 11 with implanted hydrogen at a depth of 2 $\mu$m requires, for example, an acceleration energy of approximately 220 keV. The acceleration energy used is a function of the energy distribution of the produced hydrogen and the scatter that occurs. Suitable energies are normally between 30 keV and 600 keV.

The buried sacrificial layer divides parent body 20 into layer 15 and residual body 10, both of which are of the same material as parent body 20. After implantation of the hydrogen in buried sacrificial layer 11, parent body 20 is thermally activated as a function of the material of the parent body at temperatures from 250° C. to 600° C. for 5 to 15 minutes. If parent body 20 is made of silicon, a thermal activation at a temperature of 300° C. to 500° C. for a few minutes has proven to be advantageous. In so doing, the hydrogen is activated and from then on has a doping function (flat donor) as described in the publication by Ohmura et al., *Phys. Stat. Sol.*, 15 (1973), 93, so that buried sacrificial layer 11 is, for example, preferably anodized in a subsequent electrochemical etching step. In this connection, use is made of the fact that, for example, the production of porous silicon in a silicon parent body is doping-selective and that accordingly a hydrogen implantation with a sharp stop profile in a buried sacrificial layer 11 and subsequent thermal activation produces a broad area that is preferably anodized in contrast to the surrounding area in which no hydrogen was implanted. At the same time, by annealing, the thermal activation also removes radiation damage caused, for example, by the hydrogen implantation thus in order to improve the crystal structure of parent body 20 and thin film 15' to be produced.

Figure 2:
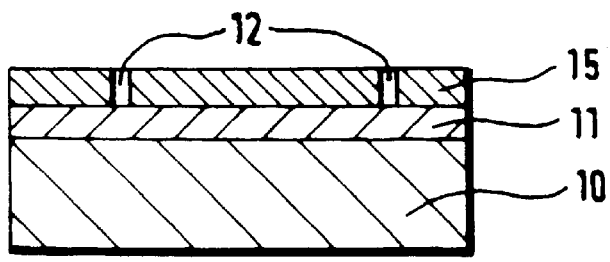
FIG. 2 shows a second step of the method according to the present invention.

The thermal activation is followed by etching or anodization of buried sacrificial layer 11. For that purpose, for example, etch holes 12 are first produced in layer 15 as shown in FIG. 2 which extend into buried sacrificial layer 11 in order to make electrolytic contacting of buried sacrificial layer 11 possible. The etch holes are produced via a conventional structuring method such as, for example, photolithographic dry or wet chemical structuring.

Figure 3:
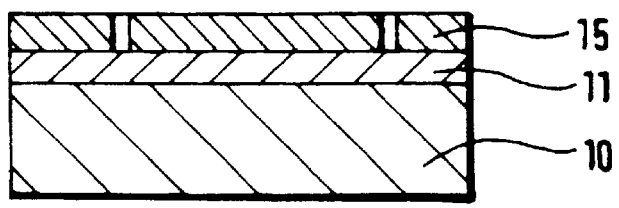
FIG. 3 shows a third step of the method according to the present invention.

Subsequently, as shown in FIG. 3, buried sacrificial layer 11 in parent body 20 made of silicon, for example, is anodized or etched over the entire surface area in a manner known per se with the aid of dilute hydrofluoric acid with a concentration of 10% to 40% or in an electrolyte containing hydrofluoric acid such as ammonium fluoride as an anodizing agent. This process is not critical with regard to time, since only the implanted area, i.e., buried sacrificial layer 11, is anodized or etched so that the etch face proceeds parallel to the surface of parent body 20 and thus makes the entire buried sacrificial layer 11 porous, i.e., converts it into a porous structure. If the parent body is made of silicon, porous silicon is thus formed in the area of buried sacrificial layer 11 which is mechanically unstable and can be easily removed by chemical means.

Figure 4:
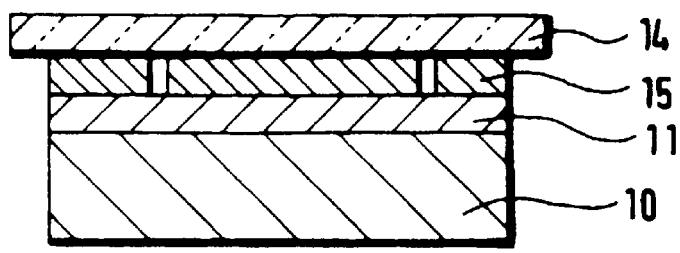
FIG. 4 shows a fourth step of the method according to the present invention.

A carrier substrate 14 is then attached to layer 15 as shown in FIG. 4 on parent body 20 which was pretreated in the manner described. This carrier substrate 14 is made, for example, of glass, metal or ceramic or is present as a wafer and in particular it may also be flexible for appropriate applications. The carrier substrate is joined to layer 15 in a manner known per se by bonding or cementing with the aid of Sealglas.

Finally, layer 15 with carrier substrate 14 located on it is separated from parent body 20 by removing sacrificial layer 11. As a result, layer 15 remains joined to carrier substrate 14 and thin film 15' to be produced comes into being on carrier substrate 14. Accordingly, residual body 10 remains from parent body 20.

Figure 5:
FIG. 5 shows a fifth step of the method according to the present invention.

Sacrificial layer 11 can be removed, for example, mechanically by breaking away or by shearing off or chemically. In the case of mechanical removal, the porous silicon of sacrificial layer 11 is used as a predetermined breaking layer. Sacrificial layer 11 can be removed chemically, for example with the aid of a 5% aqueous ammonia solution or a 5% aqueous KOH solution so that at the end of the method according to the invention according to FIG. 5, thin film 15' to be produced from monocrystalline silicon in particular is situated on any desired carrier substrate such as glass, for example, while the remaining residual body 10 is available for additional processing passes. Thus in each processing pass, only thin buried sacrificial layer 11 is consumed in a very cost-effective manner, its thickness depending only on the stop profile of the implanted hydrogen. For that reason, the use of hydrogen with a nearly monoenergetic energy distribution and consequently a sharply defined stop profile is very advantageous for reducing the thickness of sacrificial layer 11 and for increasing the number of possible processing sequences of a parent body 20.

Moreover, the method according to the present invention can also be readily used with other, particularly porous materials such as silicon carbide or germanium.

Depending on carrier substrate 14 used, the method according to the invention is advantageously followed by another thermal annealing step at temperatures from 1000° C. to 1150° C. for 30 seconds to 30 minutes in order to repair crystal defects and/or radiation damage in thin film 15' to be produced which are produced in particular in the course of the previous processing steps.

Figure 6:
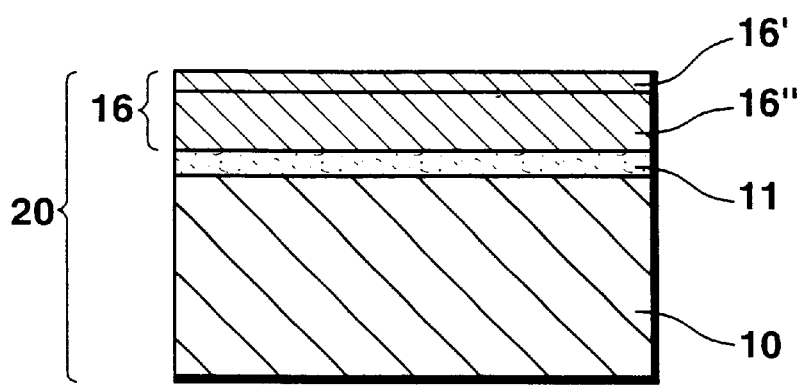
FIG. 6 shows a modified layer structure illustrated in section which is produced by a second embodiment of the method according to the present invention.

A further embodiment of the present invention, which is explained below with reference to FIG. 6, provides that an only slightly porous layer 16 is produced at first in parent body 20 of monocrystalline silicon, for example, a silicon wafer, slightly porous layer 16 corresponding to layer 15 explained in the first embodiment. Layer 16 has, for example, a thickness of 100 nm to 10 $\mu$m, preferably approximately 500 nm to 3 $\mu$m. In addition, slightly porous layer 16 is, for example, produced by electrochemical etching in a 20% to preferably 33% ethanolic hydrofluoric acid solution at room temperature for 1 minute to 20 minutes and at a current density of 1 mA/cm$^2$ to 10 mA/cm$^2$.

Subsequently, buried sacrificial layer 11 is produced in parent body 20 as explained above. In addition, the buried sacrificial layer has, for example, a thickness of 0.5 $\mu$m to 2.5 $\mu$m and is highly porous in relation to slightly porous layer 16.

As described above with reference to FIGS. 3 and 4, for example, after slightly porous layer 16 has been joined to carrier substrate 14 which is a glass substrate, wafer material or ceramic substrate with in particular high thermostability and sacrificial layer 11 has been removed, this is then followed by an annealing step at temperatures higher than 850° C., particularly 900° C. to 1100° C., for 1 minute to 2 hours in order to consolidate or reconvert slightly porous layer 16 into a monocrystalline silicon layer.

For the purpose of the present invention, typical porosity values for slightly porous layers are incidentally values ranging from 10% to 20% for open porosity. Correspondingly, highly porous layers are understood to be those with an open porosity of from 30% to 60%.

A first variant of this second embodiment, which additionally results in the production of a pn junction in slightly porous layer 16 so that this layer 16 can be used as an active layer of a thin-film solar cell, additionally provides that parent substance 20, i.e., a silicon wafer, for example, is first uniformly and completely high p-doped in a manner known per se and then superficially high n-doped in an area which is limited by an n-doped sublayer 16' to be produced later. This n-doping may take place in a conventional manner, for example, by diffusion processes or ion implantation and extends in parent substance 20 to depths of 100 nm to 2000 nm.

After this doping, slightly porous layer 16 is first produced in analogy to the second embodiment as described above. This slightly porous layer 16 is now divided into an n-doped sublayer 16' near the surface having a typical thickness of 100 nm to 2000 $\mu$m and a more deeply lying, p-doped sublayer 16" having a typical thickness of 500 nm to 10 $\mu$m resulting in the formation of a pn junction in slightly porous layer 16.

Buried sacrificial layer 11 is then formed in analogy to the first or second embodiment explained above. The further procedure for the production of a thin film made up of n-doped sublayer 16' and p-doped sublayer 16" is then analogous to the embodiments described above. Glass or ceramic is preferably used as carrier substrate 14 for the production of solar cells.

In other respects, it is advantageous if an annealing of parent substance 20 at temperatures of from 1000° C. to 1200° C. for 10 minutes to 120 minutes is first interposed immediately after the production of buried sacrificial layer 11. This annealing increases the quality of doped sublayers 16' and 16", already consolidates them at least in part and increases the porosity or improves the predetermined breaking point characteristics of buried sacrificial layer 11.

In the case of production of a thin-film solar cell, additional conventional process steps may be utilized for its completion according to the method of the present invention, such process steps essentially serving the terminal contacting of the front or back of the thin film produced and a subsequent passivization of the terminal contacts and/or the thin film produced. These process steps are, however, known and customary in solar cell technology.

Figure 7:
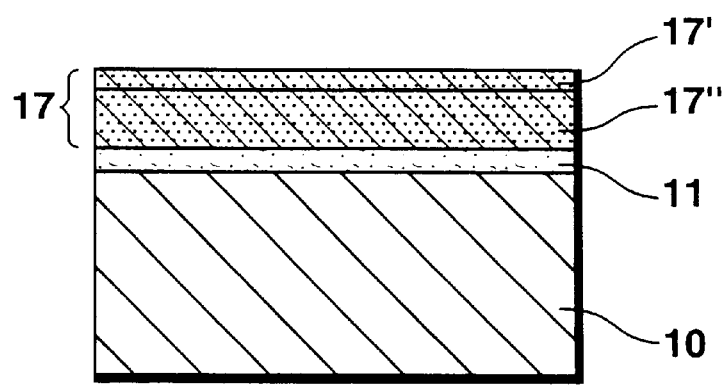
FIG. 7 shows another modified layer structure illustrated in section which is produced by a second embodiment of the method according to the present invention.

A second variant of the second embodiment which is explained below with reference to FIG. 7 provides that a slightly porous layer 17 is produced in such a way that a first sublayer 17' having a thickness of 100 nm to 2000 nm and having a mean porosity of 20% to 40% is initially produced superficially which is followed by a second sublayer 17" under it having a thickness of 500 nm to 10 $\mu$m and which is only slightly porous. The varying porosity of the first and second sublayer 17', 17" is obtained by varying current densities during the electrochemical etching. Suitable current densities are between 2 mA/cm$^2$ to 10 mA/cm$^2$.

In addition, parent substance 20 is at first uniformly and homogeneously p-doped in a conventional manner. Compared to the first variant of the second embodiment, however, the superficial n-doping of parent substance 20 by ion implantation or diffusion processes may be omitted. This superficial n-doping is instead achieved as explained in the following.

The production of sublayers 17' and 17", each with varying porosity, is then followed initially by the production of highly porous buried sacrificial layer 11 in analogy to the first or second embodiment explained above.

Subsequently, parent substance 20 is pre-annealed at temperatures of from 800° C. to 1200° C., preferably at approximately 1050° C., for 30 seconds to 30 minutes, which serves to preconsolidate the slightly porous, second sublayer 17" so that slightly porous and now consolidated second sublayer 17", which has also been p-doped via the original p-doping of the entire parent substance 20, is now enclosed between highly porous buried sacrificial layer 11 and first sublayer 17' having average porosity.

In the next processing step, an n-doping of first sublayer 17' having average porosity is undertaken. This n-doping takes place, for example, by suitably filling with gas in vacuum which is known per se after previous degassing of the porous silicon at temperatures above 400° C. or by a defined inward diffusion of suitable atoms such as phosphorus or antimony into this first sublayer 17', a method which is also known per se. Due to the now slight porosity of second sublayer 17" after the preceding annealing step, second sublayer 17" is now protected from the n-doping by, for example, the gas filling so that at least essentially only the first sublayer 17' is n-doped. Thus on the whole a new pn junction is formed in slightly porous layer 17 between first and second sublayer 17', 17". The further procedure for the completion of the thin-film solar cell is then analogous to the first variant of the second embodiment.

Thus in this case also, for example, an annealing of parent substance 20 is advantageously initially interposed at temperatures of 1000° C. to 1200° C. for 2 minutes to 120 minutes after the production of buried sacrificial layer 11. This annealing promotes the quality of sublayers 17' and 17", already consolidates them at least partially and increases the porosity or improves the predetermined breaking point characteristics of buried sacrificial layer 11. At the same time, the annealing also serves the further intensification and further activation of the undertaken doping.

The above-described second exemplary embodiment for the production of a thin-film solar cell can also be improved with respect to the efficiency of the solar cell obtained by implementing a broadband reflection filter on the side of the solar cell facing away from the incidence of light by additional layers of defined, but varying porosity and thus varying refraction indices in order to reflect the light transmitted through the stack of layers into the active area of the solar cell, i.e., the produced thin film with a pn junction, and thus increase its efficiency. Likewise, such a stack of layers with graduated porosity may be attached to the front of the solar cell facing the incidence of light as an antireflective layer in addition or as an alternative.

A further possibility for increasing the efficiency of the solar cell produced is by only incompletely consolidating slightly porous layers 16, 17 during the annealing step after they have been joined to carrier substrate 14 so that afterwards they have or recover only a partial monocrystalline crystal structure. This results in increased light scattering within layers 16 and 17 which, for example, reduces transmission of radiation through the solar cell and consequently results in improved collection of light and a higher production of charge carriers.

Additional improvements to the efficiency by multiple reflections within the solar cell are obtained by the addition of a superficial texturing of carrier substrate 14, an additional passivization layer or top layer on layers 16 or 17 or by a superficial texturing of layers 16 or 17 themselves. This texturing is achieved, for example, by etching silicon with KOH, which leads to the formation of pyramids, or by conventional dry etching methods.

What is claimed is:

1. A method for producing a thin film, comprising, in sequence:
   producing a buried sacrificial layer in an interior portion of a parent body, wherein a particular layer is defined between a surface of the parent body and the buried sacrificial layer, and wherein a residual body remains in the parent body, wherein the buried sacrificial layer separates the particular layer from the residual body;
   converting the buried sacrificial layer into a porous structure;
   attaching a carrier substrate to the particular layer; and
   mechanically removing the buried sacrificial layer, wherein the particular layer forms the thin film.

2. A method for producing a thin film from a parent body, the parent body having a surface area on at least one surface, the method comprising:
   bombarding the surface area of the parent body with hydrogen, whereby the hydrogen has a kinetic energy, whereby the hydrogen produces a buried sacrificial layer, and whereby the buried sacrificial layer defines a particular layer at the at least one surface of the parent body;
   after the step of bombarding, thermally activating the parent body;
   after the step of thermally activating, producing etch holes in the particular layer, the etch holes having a depth to reach the buried sacrificial layer; and
   after the step of producing etch holes, etching the buried sacrificial layer, wherein the buried sacrificial layer is made porous.

3. The method according to claim 2, wherein the parent body is composed of a material selected from the group consisting of silicon, silicon carbide, silicon germanium, homogeneously doped silicon, homogeneously doped germanium, homogeneously p-doped silicon with a superficial n-doping, and homogeneously p-doped germanium with the superficial n-doping.

4. The method according to claim 1, wherein the carrier substrate is a material selected from the group of materials consisting of a flexible material, a wafer, a metal, a ceramic, and a glass.

5. The method according to claim 2, wherein the thin film is substantially a monocrystalline material.

6. The method according to claim 2, wherein the buried sacrificial layer is produced at a depth of 100 nm to 10 $\mu$m from the at least on surface of the parent body.

7. The method according to claim 2, wherein the hydrogen which is implanted in the parent body has a sharp stop profile, the implanted hydrogen having a stop depth which is adjusted via a kinetic energy of the implanted hydrogen, the implanted hydrogen being implanted in the buried sacrificial layer at a depth which is adjustable via the kinetic energy to define a thickness of the particular layer.

8. The method according to claim 7, wherein the kinetic energy of the hydrogen is in a range of 30 keV to 600 keV, and wherein an energy distribution of the hydrogen is nearly monoenergetic.

9. The method according to claim 2, wherein the step of thermally activating the parent body has a duration selected in the range between 5 minutes and 15 minutes, and a temperature selected in a range between 250° C. and 600° C.

10. The method according to claim 2, wherein the step of etching is electrochemical etching-wherein the buried sacrificial layer is anodized.

11. The method according to claim 10, wherein the step of electrochemical etching is performed using an anodizing agent wherein the anodizing agent is a dilute hydrofluoric acid.

12. The method according to claim 10, wherein the anodizing agent is an electrolyte containing a hydrofluoric acid.

13. The method according to claim 2, wherein the step of producing etch holes uses a procedure selected from the group of procedures consisting of photolithographic dry structuring, wet chemical structuring and etching.

14. The method according to claim 2, further comprising:
   attaching a carrier substrate to the particular layer.

15. The method according to claim 14, further comprising:
   removing the buried sacrificial layer.

16. The method according to claim 15, wherein the step of removing the buried sacrificial layer uses a chemical etchant.

17. The method according to claim 15, wherein, after the step of removing the buried sacrificial layer, the residual body is capable of being utilized as the parent body for producing at least one additional thin film.

18. The method according to claim 17, wherein the residual body is first thermally annealed before utilizing the residual body as the parent body for producing at least one additional thin film.

19. The method according to claim 2, wherein the parent body is a pretexturized porous material.

20. The method according to claim 2, further comprising:
producing a pn junction within the particular layer.

21. The method according to claim 2, further comprising:
producing a slightly porous layer at the at least one surface of the parent body prior to the step of bombarding.

22. The method according to claim 21, wherein the slightly porous layer has a first sublayer and a second sublayer, wherein the porosity of the first sublayer is different than the porosity of the second sublayer, and wherein, after the step of bombarding, the second sublayer is located between the first sublayer and the buried sacrificial layer.

23. The method according to claim 21, wherein the slightly porous layer is substantially converted to a monocrystalline crystal structure by annealing the particular layer after being joined to the carrier substrate.

24. The method according to claim 2, wherein a thin-film solar cell is produced.

25. The method according to claim 16, wherein the chemical etchant is a dilute ammonia solution or a dilute KOH solution.

26. The method according to claim 22, further comprising:

doping the first sublayer and the second sublayer;

preconsolidating the second sublayer; and doping the first sublayer, wherein the doping of the first sublayer and the second sublayer vary.

* * * * *